(12) United States Patent
Gao et al.

(10) Patent No.: US 11,393,878 B2
(45) Date of Patent: Jul. 19, 2022

(54) DISPLAY PANEL AND DISPLAY DEVICE

(71) Applicant: Wuhan China Star Optoelectronics Semiconductor Display Technology Co., Ltd., Wuhan (CN)

(72) Inventors: Hong Gao, Wuhan (CN); Mugyeom Kim, Wuhan (CN); Yong Zhao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/481,074

(22) PCT Filed: Apr. 2, 2019

(86) PCT No.: PCT/CN2019/081020
§ 371 (c)(1),
(2) Date: Jul. 26, 2019

(87) PCT Pub. No.: WO2020/133781
PCT Pub. Date: Jul. 2, 2020

(65) Prior Publication Data
US 2021/0367004 A1 Nov. 25, 2021

(30) Foreign Application Priority Data

Dec. 28, 2018 (CN) .......................... 201811619426.X

(51) Int. Cl.
*H01L 27/32* (2006.01)

(52) U.S. Cl.
CPC ........ *H01L 27/3218* (2013.01); *H01L 27/323* (2013.01); *H01L 27/3227* (2013.01); *H01L 27/3234* (2013.01)

(58) Field of Classification Search
CPC ....... H01L 31/12; H01L 31/125; H01L 31/14; H01L 31/143; H01L 31/147; H01L 31/153; H01L 31/16; H01L 31/167; H01L 31/173; H01L 27/32; H01L 27/3206; H01L 27/3211; H01L 27/3216; H01L 27/3218;
(Continued)

(56) References Cited

U.S. PATENT DOCUMENTS

2004/0263069 A1* 12/2004 Yamazaki ......... H01L 27/14678
313/506
2009/0115802 A1* 5/2009 Nakanishi ............... H01L 31/14
345/690

(Continued)

*Primary Examiner* — Eduardo A Rodela
(74) *Attorney, Agent, or Firm* — Nathan & Associates; Menachem Nathan

(57) ABSTRACT

A display panel and a display device are provided. The display panel includes a display region and a sensor region. The sensor region is provided with multiple sensors in the display panel. Multiple first pixels are arranged in the display region. The first pixels are arranged as a first array in the display region. Multiple second pixels are arranged in the sensor region, and the second pixels are arranged as a second array in the sensor region. A pixel unit area of the first array is equal to a pixel unit area of the second array, and the pixel unit area is a number of the pixels multiplied by an area of each pixel in a unit area. The display device includes the display panel and the sensors. The sensors are disposed on one side of the display panel.

7 Claims, 4 Drawing Sheets

(58) Field of Classification Search
CPC .............. H01L 27/322; H01L 27/3225; H01L 27/3227; H01L 27/323; H01L 27/3234; H01L 27/3269
See application file for complete search history.

(56) References Cited

U.S. PATENT DOCUMENTS

| | | | | |
|---|---|---|---|---|
| 2012/0320307 | A1* | 12/2012 | Aichi | H01L 27/1446 349/61 |
| 2018/0113566 | A1* | 4/2018 | Shigemori | G06F 3/04186 |
| 2018/0225500 | A1* | 8/2018 | Han | H01L 27/323 |
| 2018/0357460 | A1* | 12/2018 | Smith | H01L 27/3227 |
| 2019/0035859 | A1* | 1/2019 | Kang | G06F 3/0448 |
| 2019/0043420 | A1* | 2/2019 | Jung | G09G 3/3225 |
| 2019/0095674 | A1* | 3/2019 | Ko | G02B 6/08 |
| 2019/0103443 | A1* | 4/2019 | Kim | H01L 51/5253 |
| 2019/0130155 | A1* | 5/2019 | Park | H01L 27/3211 |
| 2019/0237008 | A1* | 8/2019 | Ho | H01L 27/3269 |
| 2020/0203445 | A1* | 6/2020 | Ou | H01L 27/3216 |

* cited by examiner

DISPLAY PANEL AND DISPLAY DEVICE

1. FIELD OF DISCLOSURE

The present invention relates to a field of display devices and in particular, to a display panel and a display device.

2. DESCRIPTION OF RELATED ART

At present, mobile electronic devices, such as mobile phones, are widely used in people's daily work and life, and become a necessity for people to carry around. Moreover, in order to satisfy people's needs in social life and entertainment activities, mobile electronic devices generally have a camera function. Camera lenses are widely used in display screens and tablet computers, but most traditional camera lenses are directly exposed to the outside, and an area for placing a camera lens is reserved on a front side or a back side of the mobile electronic device, and the camera lens needs to be exposed to the outside, so that a charge coupled device in the camera lens obtains image information of an external object.

However, in today's full-screen trend, a full-screen smart phone is provided to increase an effective display area and also enhance aesthetics. Although various mobile phone manufacturers have proposed a variety of solutions, a front opening is always a difficult problem to deal with. As a result, in order to achieve a real full screen, manufacturers are actively developing a technology for an under-screen camera lens.

SUMMARY

It is an objective of the present invention to provide a display panel and a display device thereof, which places a camera lens under a screen, and solves a problem that a sensor region and a display region have ununiform luminance, so that luminance in the two regions can be similar, and the human eye cannot distinguish the difference in luminance.

Accordingly, the present invention provides a display panel, comprising:
a display region;
a sensor region, the sensor region being disposed with a plurality of sensors;
a plurality of first pixels being disposed in the display region, the first pixels being arranged as a first array in the display region; and
a plurality of second pixels disposed in the sensor region, the second pixels being arranged as a second array in the sensor region;
wherein a pixel unit area of the first array is equal to a pixel unit area of the second array, and the pixel unit area is a number of the pixels multiplied by an area of each pixel in a unit area.

The first pixels and the second pixels both comprise a plurality of blue sub-pixels, a plurality of red sub-pixels, and a plurality of green sub-pixels.

An area of each blue sub-pixel of the first pixels is less than an area of each blue sub-pixel of the second pixels.

An area of each red sub-pixel of the first pixels is less than an area of each red sub-pixel of the second pixels.

An area of each green sub-pixel of the first pixels is less than an area of each green sub-pixel of the second pixels.

At least one transition region is disposed between the display region and the sensor region, the at least one transition region is provided with a plurality of third pixels, the third pixels are arranged as a third array in the at least one transition region, and a pixel unit area of the third array is equal to the pixel unit area of the first array or the second array.

The third pixels comprise a plurality of blue sub-pixels, a plurality of red sub-pixels, and a plurality of green sub-pixels, an area of each blue sub-pixel of the third pixels is between an area of each blue sub-pixel of the first pixels and an area of each blue sub-pixel of the second pixels, an area of each red sub-pixel of the third pixels is between an area of each red sub-pixel of the first pixels and an area of each red sub-pixel of the second pixels, and an area of each green sub-pixel of the third pixels is between an area of each green sub-pixel of the first pixels and an area of each green sub-pixel of the second pixels.

The transition region comprises the first pixels and the second pixels, and the first pixels and the second pixels are arrayed spaced apart in the display region.

The sensor region comprises at least one sub-sensor region, and the at least one sub-sensor region is disposed corresponding to the sensors.

The sensors comprise one or a combination of a camera sensor, a breathing light sensor, a distance sensor, a fingerprint scanner sensor, a microphone sensor, or a transparent antenna sensor.

A display device, comprising the display panel and the sensors mentioned above, the sensors are disposed on one side of the display panel.

The present invention has advantages as follows. The present invention provides a display panel and a display device, whereby a front camera lens is placed under a screen, and through the technology of placing the camera lens under the screen, a pixel area for emitting light in a display region is equal to a pixel region for emitting light in a sensor region. This is the pixel configuration principle for the display region and the sensor region, so that the sensor region and the display region which are arranged corresponding to the camera lens have uniform luminance. The display region and the sensor region have uniform luminance when displaying a white picture, so that the human eye cannot tell a difference in luminance.

DETAILED DESCRIPTION OF EMBODIMENTS

Embodiments of the present disclosure are described in detail with reference to the accompanying drawings as follows. Directional terms such as up/down, front/rear, right/left, inside/outside, and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

Figure 1:
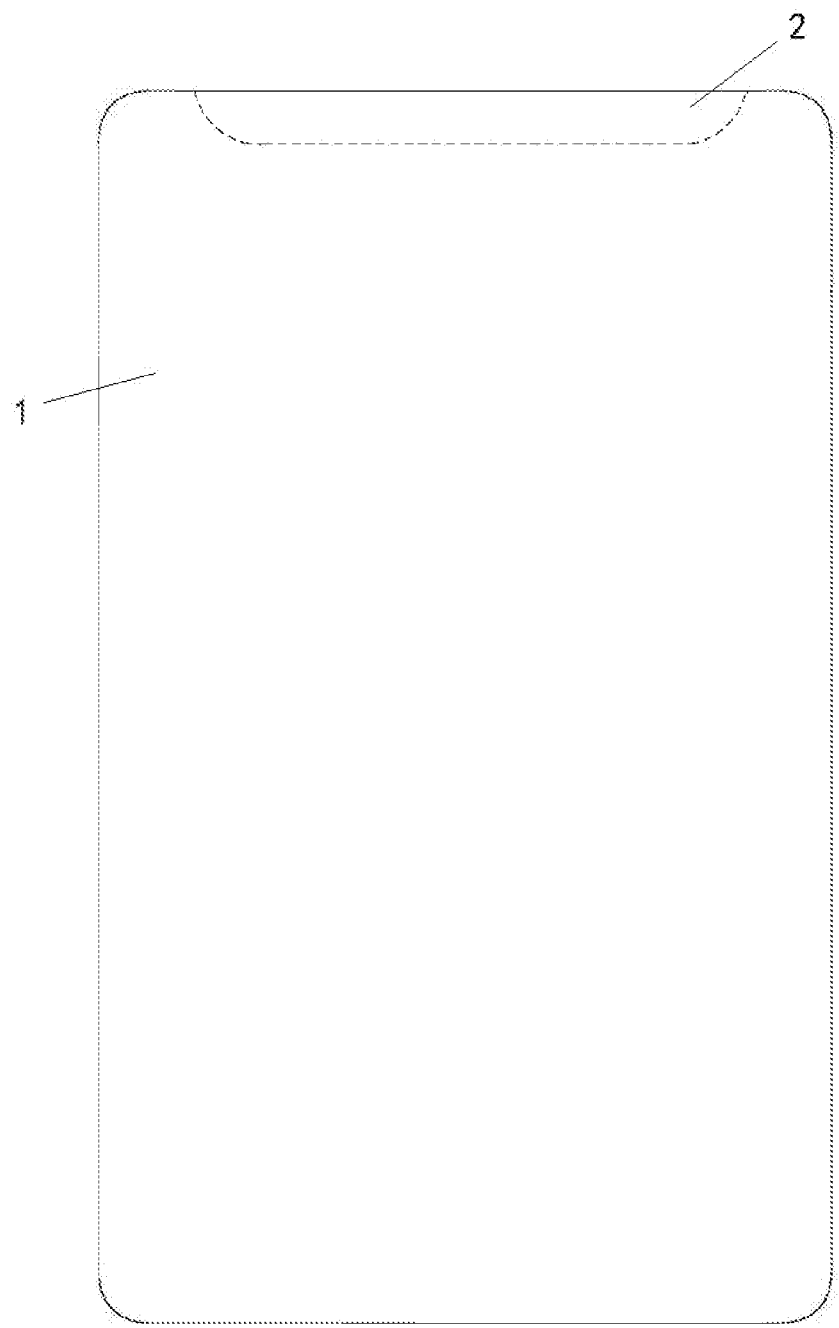
FIG. 1 is a schematic structural view illustrating a display panel according to a first embodiment of the present invention.
Figure 2:
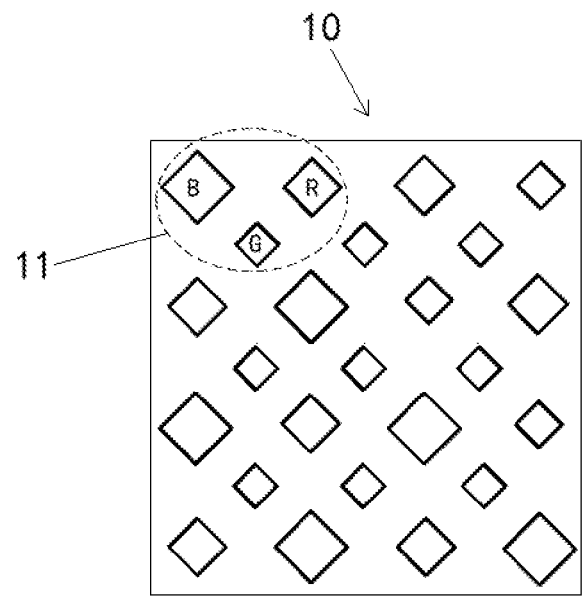
FIG. 2 is a schematic structural view illustrating a first array in a display region of the display panel according to the first embodiment of the present invention.
Figure 3:
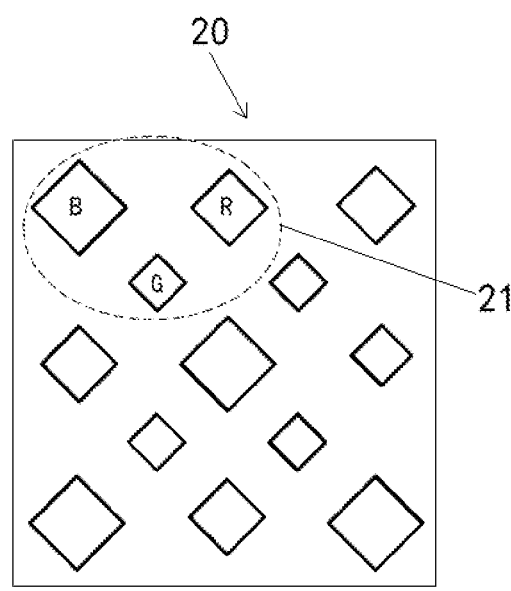
FIG. 3 is a schematic structural view illustrating a second array in a sensor region of the display panel according to the first embodiment of the preset invention.

Referring to FIGS. 1 to 3, a display panel is provided according to a first embodiment of the present invention, comprising:

a display region 1;

a sensor region 2, the sensor region 2 being disposed with a plurality of sensors;

a plurality of first pixels 11 disposed in the display region 1, the first pixels 11 being arranged as a first array 10 in the display region 1; and a plurality of second pixels 21 disposed in the sensor region 2, the second pixels 21 being arranged as a second array 20 in the sensor region 2;

wherein a pixel area per unit area of the first array 10 is equal to a pixel area per unit area of the second array 20. The pixel area per unit area of the first array 10 is a number of the first pixels 11 per unit area multiplied by an area of the number of the first pixels 11. The pixel area per unit area of the second array 20 is a number of the second pixels 21 per unit area multiplied by an area of the number of the second pixels 21. Such a configuration ensures that the display region 1 and the sensor region 2 have the same luminance when displaying a white picture.

Referring to FIGS. 2 and 3, the first pixels 11 and the second pixels 21 both comprise a plurality of blue sub-pixels, a plurality of red sub-pixels, and a plurality of green sub-pixels.

An area of each blue sub-pixel of the first pixels 11 is less than an area of each blue sub-pixel of the second pixels 21.

An area of each red sub-pixel of the first pixels 11 is less than an area of each red sub-pixel of the second pixels 21.

An area of each green sub-pixel of the first pixels 11 is less than an area of each green sub-pixel of the second pixels 21.

Specifically, the present invention defines $\Sigma(aB+bG+cR)=\Sigma(a'B'+b'G'+c'R')$. That is, an area occupied by the first pixels 11 per unit area in the display region 1 is equal to an area occupied by the second pixels 21 per unit area in the sensor region 2, wherein a=a pixel density of the blue sub-pixels in the display region 1, b=a pixel density of the green sub-pixels in the display region 1, c=a pixel density of the red sub-pixels in the display region 1, a'=a pixel density of the blue sub-pixels in the sensor region 2, b'=a pixel density of the green sub-pixels in the sensor region 2, c'=a pixel density of the red sub-pixels in the sensor region 2, B=an area of each blue sub-pixel in the display region 1, G=an area of each green sub-pixel in display region 1, R=an area of each red sub-pixel in the display region 1, B'=an area of each blue sub-pixel in the sensor area 2, G'=an area of each green sub-pixel in the sensor region 2, and R=an area of each red sub-pixel in the sensor region 2.

It can be understood that when the first pixels 11 and the second pixels 21 have the same color, an area of the first pixels 11 is smaller than an area of the second pixels 21. When a white picture is displayed, it is ensured that the display area 1 and the sensor area 2 are uniform in luminance.

Figure 4:
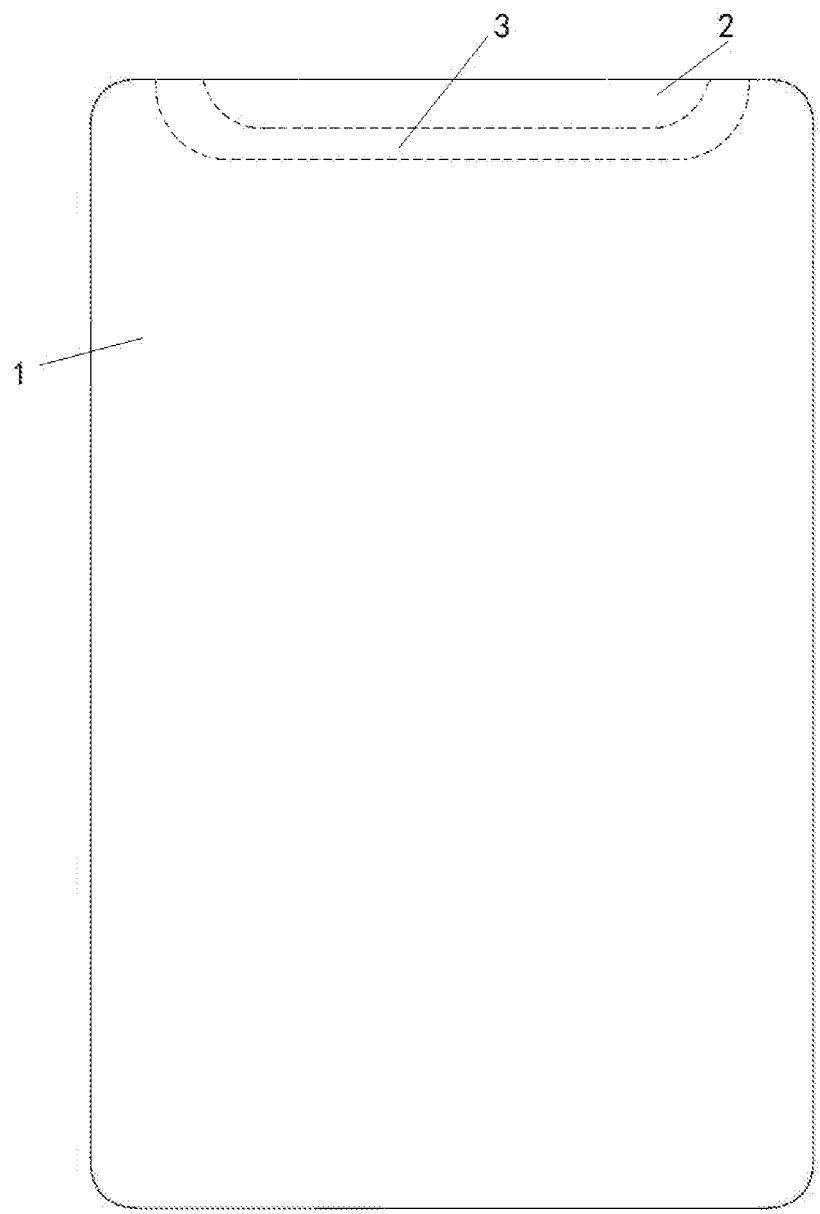
FIG. 4 is a schematic structural view illustrating the display panel according to a second embodiment of the present invention.
Figure 5:
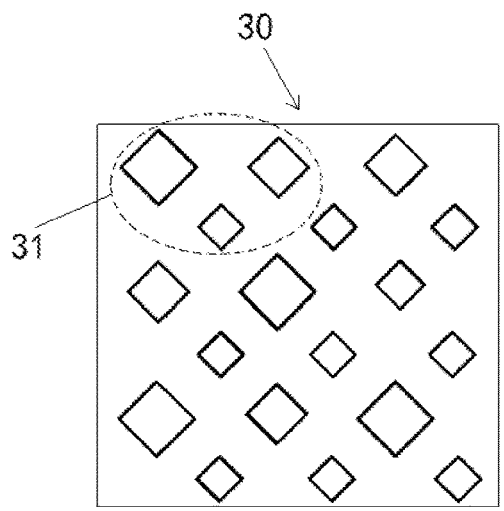
FIG. 5 is a schematic structural view illustrating a third array in a transition region of the display panel according to the second embodiment of the present invention.

Referring to FIG. 4 and FIG. 5, in a second embodiment of the present invention, in order to further ensure uniform luminance in the display region 1 and the sensor region 2, at least one transition region 3 is disposed between the display region 1 and the sensor region 2. The at least one transition region 3 is provided with a plurality of third pixels 31. The third pixels 31 are arranged as a third array 30 in the at least one transition region 3. A pixel unit area of the third array 30 is equal to the pixel unit area of the first array 10 or the second array 20. When a white picture is displayed, it is ensured that the transition region 3, the display region 1, and the sensor region 2 are uniform in luminance.

The third pixels 31 comprise a plurality of blue sub-pixels, a plurality of red sub-pixels, and a plurality of green sub-pixels, an area of each blue sub-pixel of the third pixels 31 is between an area of each blue sub-pixel of the first pixels 11 and an area of each blue sub-pixel of the second pixels 21, an area of each red sub-pixel of the third pixels 31 is between an area of each red sub-pixel of the first pixels 11 and an area of each red sub-pixel of the second pixels 21, and an area of each green sub-pixel of the third pixels 31 is between an area of each green sub-pixel of the first pixels 11 and an area of each green sub-pixel of the second pixels 21.

The transition region 3 comprises the first pixels 11 and the second pixels 21, and the first pixels 11 and the second pixels 21 are arrayed spaced apart in the display region 1.

Figure 6:
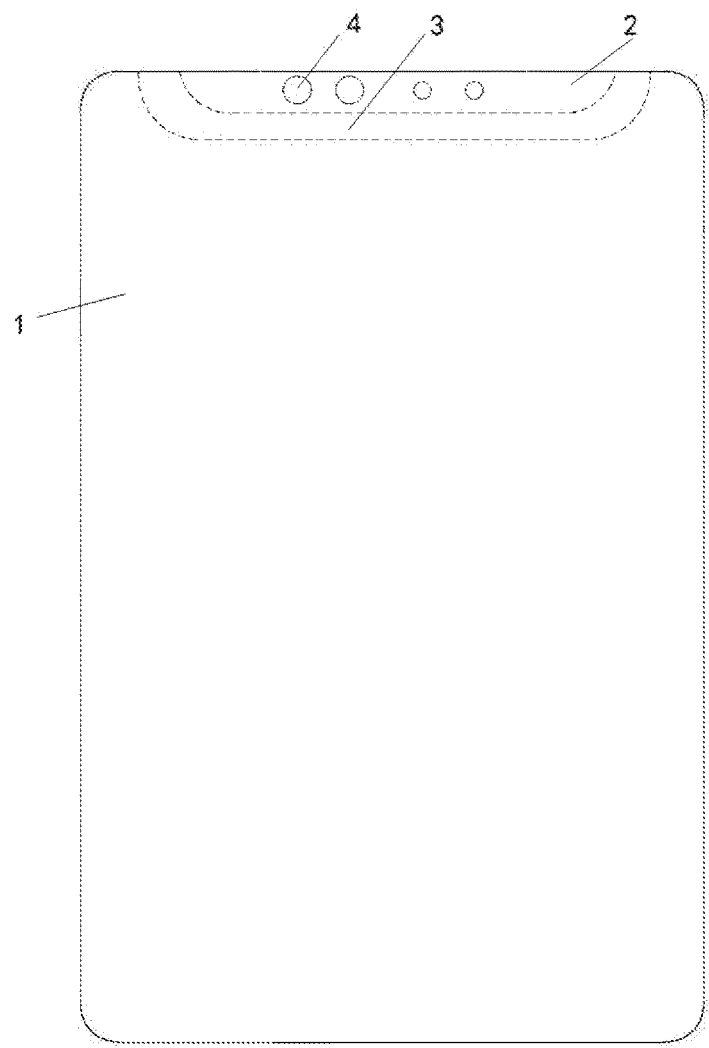
FIG. 6 is a schematic structural view illustrating the display panel according to a third embodiment of the present invention.

Referring to FIG. 6, in a third embodiment of the present invention, the sensor region 2 comprises at least one sub-sensor region 4, and the at least one sub-sensor region 4 is disposed corresponding to the sensors (not illustrated) in the display panel.

The sensors (not illustrated) comprise one or a combination of a camera sensor, a breathing light sensor, a distance sensor, a fingerprint scanner sensor, a microphone sensor, or a transparent antenna sensor.

According to another embodiment of the present invention, a display device is provided, comprising the display panel and the sensors (not illustrated) mentioned above, the sensors are disposed on one side of the display panel.

The display panel of the present invention can be used in various occasions, and can be combined with various devices and structures. The display device can be either a mobile terminal (e.g., a mobile phone or a smart wearable device) or a fixed terminal (PC), or other devices having a display function, such as a tablet, a television, and a display window. It should be understood that, for functionality, the display panel of the present invention has other devices, structures, and the like which are not shown in this specification.

The present invention has advantages as follows. The present invention provides the display panel and the display device, whereby a front camera lens is placed under a screen, and through the technology of placing the camera lens under the screen, the pixel area for emitting light in the display region is equal to the pixel area for emitting light in the sensor region. Through this pixel configuration principle for the display region and the sensor region, the sensor region and the display region which are arranged corresponding to the camera lens have uniform luminance. The display region and the sensor region have uniform luminance when displaying a white picture, so that the human eye cannot tell a difference in luminance.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A display panel, comprising:
 a display region;
 a sensor region, the sensor region being disposed with a plurality of sensors;
 a plurality of first pixels disposed in the display region, the first pixels arranged as a first array in the display region; and
 a plurality of second pixels disposed in the sensor region, the second pixels arranged as a second array in the sensor region;
 wherein a pixel area per unit area of the first array is equal to a pixel area per unit area of the second array, wherein the pixel area per unit area of the first array is a number of the first pixels per unit area multiplied by an area of the number of the first pixels, and the pixel area per unit area of the second array is a number of the second pixels per unit area multiplied by an area of the number of the second pixels;
 wherein the first pixels and the second pixels both comprise a plurality of blue sub-pixels, a plurality of red sub-pixels, and a plurality of green sub-pixels;
 wherein an area of each blue sub-pixel of the first pixels is less than an area of each blue sub-pixel of the second pixels, an area of each red sub-pixel of the first pixels is less than an area of each red sub-pixel of the second pixels, and an area of each green sub-pixel of the first pixels is less than an area of each green sub-pixel of the second pixels.

2. The display panel according to claim 1, wherein at least one transition region is disposed between the display region and the sensor region, the at least one transition region is provided with a plurality of third pixels, the third pixels are arranged as a third array in the at least one transition region, and a pixel area per unit area of the third array is equal to the pixel area per unit area of the first array or the second array.

3. The display panel according to claim 2, wherein the third pixels comprise a plurality of blue sub-pixels, a plurality of red sub-pixels, and a plurality of green sub-pixels, an area of each blue sub-pixel of the third pixels is between an area of each blue sub-pixel of the first pixels and an area of each blue sub-pixel of the second pixels, an area of each red sub-pixel of the third pixels is between an area of each red sub-pixel of the first pixels and an area of each red sub-pixel of the second pixels, and an area of each green sub-pixel of the third pixels is between an area of each green sub-pixel of the first pixels and an area of each green sub-pixel of the second pixels.

4. The display panel according to claim 2, wherein the transition region comprises the first pixels and the second pixels, and the first pixels and the second pixels are arrayed spaced apart in the display region.

5. The display panel according to claim 2, wherein the sensor region comprises at least one sub-sensor region, and the at least one sub-sensor region is disposed corresponding to the sensors.

6. The display panel according to claim 1, wherein the sensors comprise one or a combination of a camera sensor, a breathing light sensor, a distance sensor, a fingerprint scanner sensor, a microphone sensor, or a transparent antenna sensor.

7. A display device, comprising the display panel and the sensors of claim 1, wherein the sensors are disposed on one side of the display panel.

* * * * *